United States Patent
Saranathan et al.

(10) Patent No.: US 6,265,875 B1
(45) Date of Patent: Jul. 24, 2001

(54) METHOD AND APPARATUS FOR EFFICIENT MRI TISSUE DIFFERENTIATION

(75) Inventors: Manojkumar Saranathan; Thomas K. F. Foo, both of Rockville, MD (US)

(73) Assignee: General Electric Company, Milwaukee, WI (US)

( * ) Notice: Subject to any disclaimer, the term of this patent is extended or adjusted under 35 U.S.C. 154(b) by 0 days.

(21) Appl. No.: 09/313,107

(22) Filed: May 17, 1999

(51) Int. Cl.[7] ........................................ G01V 3/00
(52) U.S. Cl. ............................................ 324/314
(58) Field of Search ........................ 324/314, 309, 324/307, 306, 300, 318, 322

(56) References Cited

U.S. PATENT DOCUMENTS

| | | | |
|---|---|---|---|
| 5,572,126 | * 11/1996 | Shinnar | 324/314 |
| 5,619,138 | * 4/1997 | Rourke | 324/309 |
| 5,821,752 | * 10/1998 | LeRoux | 324/314 |
| 5,926,021 | * 7/1999 | Hennig | 324/306 |

OTHER PUBLICATIONS

Balaban, R.S., et al., Magnetization Transfer Contrast in MR Imaging of the Heart. *Radiology*, 180(3), p. 671–5 (1991).

Foo, Thomas K.F., et al., Automated Detection of Bolus Arrival and Initiation of Data Acquisition in Fast, Three–Dimensional, Gadolinium–enhanced MR Angiography. *Radiology*, 203, p. 275–280 (1997).

Hu, Bob S., et al., Pulsed Saturation Transfer Contrast. *Magnetic Resonance in Medicine*, 26, p. 231–240 (1992).

Prince, Martin R., et al., Contrast–enhanced Abdominal MR Angiography: Optimization of Imaging Delay Time by Automating the Detection of Contrast Material Arrival in the Aorta. *Radiology*, 203, p. 109–114 (1997).

Schnall, M.D., Technique for Magnetization Transfer Imaging at 1.5 T Using Steady State Pulsed Saturation, *Society of Magnetic Resonance in Medicine, Tenth Annual Scientific Meeting and Exhibition*, vol. 1, Aug. 10–16, 1991, Book of Abstracts.

Pauly, J. Parameter Relations for the Shinnar–Le Roux Selective Excitation Pulse Design Algorithm, *IEEE Transactions on Medical Imaging*, vol. 10, No. 1, Mar. 1991.

* cited by examiner

*Primary Examiner*—Louis Arana
(74) *Attorney, Agent, or Firm*—Timothy J. Ziolkowski; Christian G. Gabou; Phyllis Y. Price (57) ABSTRACT

The present invention relates generally to magnetic resonance imaging (MRI), and more particularly to a method and apparatus for efficient MRI tissue differentiation using an RF pulse designed to provide a frequency response combining a magnetization transfer contrast and fat saturation simultaneously. The invention includes creating a spectrally selective suppression pulse having an RF pulse profile designed to produce a frequency response with adequate fat suppression and selecting a spectrally selective suppression amplitude to produce a magnetization transfer contrast between two different tissue types, such as between proteinated tissue and water-based tissue. The invention also includes applying the spectrally selective suppression pulse with a flip angle selected to optimize fat suppression and magnetization transfer contrast saturation simultaneously. The invention is particularly useful in magnetic resonance angiography (MRA) as a non-invasive alternative to x-ray angiography to image coronary arteries. The invention is capable of efficiently suppressing fat and myocardium and provide an MR image with enhanced visibility of cardiac vessels.

29 Claims, 4 Drawing Sheets

METHOD AND APPARATUS FOR EFFICIENT MRI TISSUE DIFFERENTIATION

BACKGROUND OF THE INVENTION

The present invention relates generally to magnetic resonance imaging (MRI), and more particularly to a method and apparatus for efficient MRI tissue differentiation using an RF pulse designed to provide a frequency response combining a magnetization transfer contrast and fat suppression simultaneously.

Coronary artery disease is currently the leading cause of death in western hemisphere countries. Therefore, the visualization of the coronary arteries is an important step in preventing deaths due to coronary artery disease. Currently, coronary artery visualization is accomplished using x-ray contrast angiography, a highly invasive procedure. In x-ray angiography, a catheter is inserted into the artery through the groin area of a patient in order to accomplish x-ray angiography. It would be advantageous to acquire angiographic images of the coronary arteries without having to require such an invasive procedure.

Magnetic resonance angiography (MRA) is a non-invasive alternative to x-ray angiography that has been successfully used to image carotid arteries, the aorta, and other peripheral vessels. However, coronary arteries are small, tortuous vessels, usually no more than 1–5 mm. in diameter. Successful visualization of coronary arteries using conventional MRA is hampered because coronary arteries are often surrounded by pericardial fat and myocardium, especially the more distal segments. Under known methods, a high degree of fat suppression can be achieved using standard chemical saturation pulses. However, suppression of the myocardial signal, without an accompanying reduction in the blood signal, has heretofore been a challenging problem. Since the myocardial signal is a significant attribute to the contrast-to-noise ratio (CNR) of the coronary arteries, suppression of myocardium is essential for reliable visualization of more complete portions of the left anterior descending (LAD) coronary arteries, as well as the distal segments of the right coronary artery.

A technique known as magnetization transfer contrast (MTC) has been commonly employed in imaging sequences to improve image contrast but has heretofore been employed only in limited manner in MRA of the coronary arteries because of various limitations. The MTC technique relies on the fact that a fraction of the water in biological systems is bound to large macromolecules. This results in lowering of their tumbling rates and consequently, their relaxation times. The "bound pool" is in chemical exchange with the "free pool", therefore resulting in transfer of magnetization. Saturation of the bound pool will then result in saturation of the free pool. MTC effects have been found to adequately suppress myocardial signals in human and animal hearts and can be produced by using either a binomial, zero-degree on-resonance excitation, or an off-resonance spectrally selective excitation. In the past, the off-resonance irradiation utilizes RF pulses of high $B_1$ amplitude and are set to at least 1 kHz from the water resonance frequency. The large resonance offset avoids undesired saturation of spins with long $T_2$ times in the imaged volume. However, the further off-resonance the irradiation is, the higher the RF power level is required for observable MTC effects. Continuous wave MTC results in too high of a specific absorption rate (SAR) to the patient, and requires an ancillary RF amplifier on conventional whole-body MR imaging scanners, and is therefore not widely used or desirable.

The off-resonant MTC technique is most effectively achieved using a train of Gaussian pulses of fixed bandwidth, for example, 500 Hz, at 1500 Hz off-resonance. The entire duration of the MTC pulse composite is typically about 200–300 ms. In MRA using a cardiac-gated 3D fast-gradient recalled echo sequence, several problems arise. First, the specific absorption rate of these pulses is very high, thereby limiting its use. It also prohibits use of continuous RF excitation, which is another mechanism for suppressing myocardial signals that can be used in conjunction with magnetization transfer based methods. However, when such RF pulses are applied at a time-delay from the start of the R-wave in the R—R interval, until mid-diastole, the resulting pulses are quite long and consequently not practical for use in interleaved or segmented 3D fast gradient recalled echo sequence, hybrid sequences, where multiple k-space lines are acquired in the same R—R interval, or any other fast image acquisition sequence.

It would therefore be desirable to have a method and apparatus capable of imaging coronary arteries with a lower effective specific absorption rate using the advantages of the MTC effect without the disadvantages while simultaneously suppressing fat tissue to provide enhanced visibility of tissue where the contrast between blood and the surrounding tissue is typically poor.

SUMMARY OF THE INVENTION

The present invention relates to a system and method for differentiating tissue types in MR imaging that can efficiently discriminate fat tissue from proteinated tissues, and each from water-based tissue, that solves the aforementioned problems.

In order to accomplish efficient MR angiography of coronary arteries, or MR images in any portion of the body where contrast between water-based tissue and the surrounding tissue is typically poor, the present invention combines fat suppression and magnetization transfer (MT) in an RF pulse to overcome the aforementioned problems. Two basic approaches are described. In one approach, by overdriving a fat saturation pulse that is off-resonant, the pulse can be designed to induce an MT effect by increasing the flip angle based on the amount of MT effect and fat suppression desired. However, increasing the flip angle, or the effective $B_1$, of a fat saturation pulse that increases the MTC effect is done at the cost of degrading fat suppression at certain flip angles and care must be taken so as to not exceed the specific absorption rate desirable for a patient.

Another approach includes modulating an RF pulse with a sinusoidal function, such as that provided in a Hadamard excitation pulse. The frequency response of the resultant pulse is the frequency response of the original RF pulse shifted in frequency to both sides of the carrier. The spacing of the pulses is determined by the frequency of the modulation function. Using a Hadamard encoded pulse for fat saturation provides excitation on both sides of the transmitter frequency which provides an effective MTC effect equivalent to twice that of an equivalent single fat saturation pulse with MTC. Thus, using a Hadamard pulse, the same flip angle can be maintained for fat suppression and yet double the available MTC effect.

Therefore, in accordance with one aspect of the invention, a method of differentiating tissue in NMR imaging includes the steps of creating a spectrally selective suppression pulse having an RF pulse profile designed to produce a frequency response with high fat suppression and selecting a spectrally selective suppression amplitude to produce a magnetization transfer contrast between two tissue types. The method also includes applying the spectrally selective suppression pulse with a flip angle selected to optimize fat suppression and magnetization transfer contrast saturation simultaneously.

In accordance with another aspect of the invention, an MRI apparatus for MR angiography is disclosed that is capable of efficient tissue differentiation that includes an MRI system having a number of gradient coils positioned about a bore of a magnet to impress a polarizing magnetic field and an RF transceiver system having an RF modulator controlled by a pulse control module to transmit RF signals to an RF coil assembly to acquire MR images. The MRI apparatus also includes a computer programmed to construct a desired RF pulse based on input design criteria that includes desired bandwidth, desired percentage in-band (pass band) ripple, and desired percentage out-of-band (stop-band) ripple, and a desired flip angle so that the desired RF pulse has low stop and pass band ripple and high transition band slope. These design parameters are needed to ensure uniform suppression of the fat signal within the pass-band and minimize saturation of the blood and tissue signal in the stop-band. The computer is also programmed to select an RF pulse frequency for the desired RF pulse proportional to a fat tissue resonance frequency and to select an RF pulse amplitude of the desired RF pulse to obtain both optimal fat suppression and to obtain a substantial MTC effect between proteinated tissue and water tissue. The system then transmits the desired RF pulse to the pulse control module to transmit RF signals to the RF coil assembly to acquire MR images having fat suppression and MTC effects between proteinated tissue and water tissue simultaneously. The acquired MR images enhance the contrast between the proteinated tissue and the water tissue, while at the same time suppressing fat tissue.

In accordance with yet another aspect of the invention, a computer system is disclosed for use with an MRI apparatus comprising a computer programmed from a computer readable storage medium having thereon a computer program programmed to create a spectrally selective suppression pulse having an RF pulse profile designed to produce a frequency and amplitude response with high fat suppression and to select a spectrally selective suppression amplitude to produce a magnetization transfer contrast between two tissue types. The computer is also programmed to apply the spectrally selective suppression pulse with a flip angle selected to optimize fat suppression and magnetization transfer contrast saturation simultaneously for use by the MRI apparatus.

Various other features, objects and advantages of the present invention will be made apparent from the following detailed description and the drawings.

BRIEF DESCRIPTION OF THE DRAWINGS

The drawings illustrate the best mode presently contemplated for carrying out the invention.

In the drawings.

DETAILED DESCRIPTION OF THE PREFERRED EMBODIMENT

Figure 1:
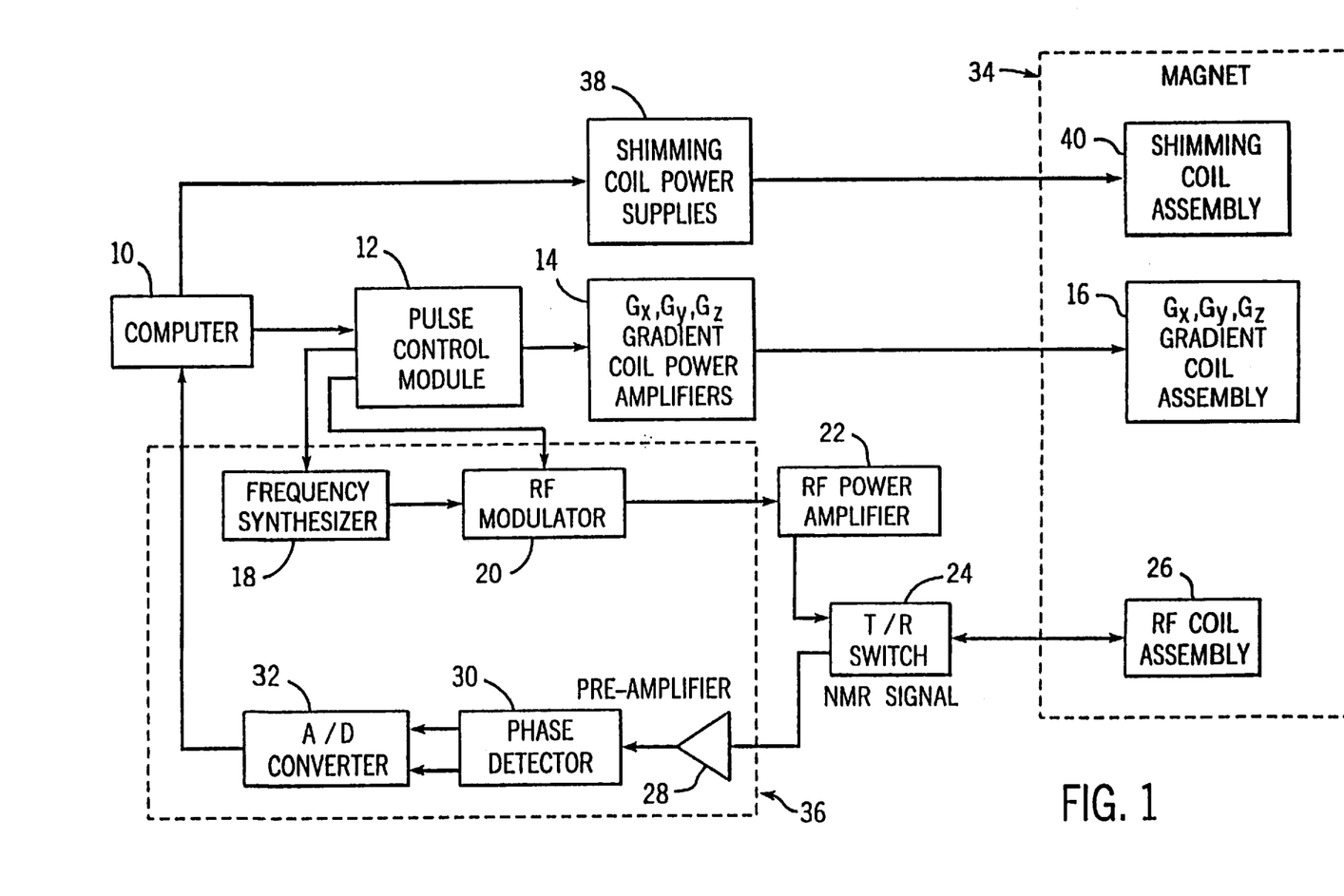
FIG. 1 is a schematic block diagram of an NMR imaging system for use with the present invention.

Referring to FIG. 1, a nuclear magnetic resonance (NMR) imaging system 8 of a type suitable for the practice of the invention includes a computer 10 which controls gradient coil power amplifiers 14 through a pulse control module 12. The pulse control module 12 and the gradient amplifiers 14 together produce the proper gradient waveforms Gx, Gy, and Gz, for either a spin echo, a gradient recalled echo pulse sequence, a fast spin echo, or other type of pulse sequences. The gradient waveforms are connected to gradient coils 16 which are positioned around the bore of the magnet 34 so that gradients Gx, Gy, and Gz are impressed along their respective axes on the polarizing magnetic field Bo from magnet 34.

The pulse control module 12 also controls a radio frequency synthesizer 18 which is part of an RF transceiver system, portions of which are enclosed by dashed line block 36. The pulse control module 12 also controls an RF modulator 20 which modulates the output of the radio frequency synthesizer 18. The resultant RF signals, amplified by power amplifier 22 and applied to RF coil 26 through transmit/receive switch 24, are used to excite the nuclear spins of the imaged object (not shown).

The NMR signals from the excited nuclei of the imaged object are picked up by the RF coil 26 and presented to preamplifier 28 through transmit/receive switch 24, to be amplified and then processed by a quadrature phase detector 30. The detected signals are digitized by a high speed A/D converter 32 and applied to computer 10 for processing to produce NMR images of the object. Computer 10 also controls shimming coil power supplies 38 to power shimming coil assembly 40.

The present invention includes a method and system for MR imaging that differentiates water-based tissue from proteinated tissue while simultaneously suppressing fat tissue, which is particularly useful in MR angiography (MRA), but is applicable to any MR imaging of any portion of the body in which enhanced contrast between blood tissue and the surrounding tissue is poor. The present invention combines magnetization transfer contrast techniques with a fat suppression pulse to produce an MR image with enhanced tissue differentiation. In particular, since coronary arteries are small, tortuous vessels, typically between 1–5 mm in diameter, the visualization of such vessels using MRA is hampered because they are often surrounded by pericardial fat and also embedded in myocardium. In the present invention, a high degree of fat suppression is achieved by using a standard method for spectral chemical saturation, while suppression of the myocardial signal is achieved by combining a magnetization transfer contrast (MTC) pulse with the fat suppression pulse to avoid a concomitant reduction in the blood signal. This results in a significantly increased contrast-to-noise ratio of the coronary arteries allowing the use of MRA in place of the highly invasive x-ray angiography. In order to maintain good fat suppression and MTC effect, while avoiding direct saturation of the on-resonance (water) spins, a specially designed RF pulse with requisite features must be used.

Magnetization transfer imaging alters the contrast in MR images by saturating the short $T_2$ species present in tissue. Off-resonance continuous wave and pulsed short $T_2$ selective saturation alters the relaxation mechanisms governing tissue contrast, thus causing some spins close to the saturated species to experience longer $T_2$ and $T_1$ times. The continuous wave MT technique requires the application of lower power off-resonance irradiation. The pulsed MT technique reduces the overall specific absorption rate by applying periodic RF pulses, avoids the need for a secondary RF transmitter, and significantly reduces the total average RF power transmitted. Therefore, the pulsed MT technique is preferred.

The power required by a radio frequency pulse depends on the difference between the transmit and the resonance frequencies. The distance traversed by the magnetization, which is a product of the effective flip angle, increases as the transmission frequency moves off-resonance. The effective flip angle is calculated from the pulse field strength and the transmit frequency difference, and is given by:

$$\alpha_{effective} = \omega_{effective} t = [(\omega_0 - \omega_{transmit})2 + (\gamma B_1)2] \frac{1}{2} t,$$

where $\omega_{transmit}$ is the transmit frequency, $\omega_0$ is the resonance frequency, $B_1$ is the pulse field strength, t is the transmit time, $\gamma$ is the gyomagnetic ratio, a physical constant and $\alpha_{effective}$ is the effective flip angle. Therefore, by transmitting close to resonance, a substantial reduction in absorbed RF power is accomplished. The use of such pulses provides efficient saturation of short $T_2$ species. Applying these binomial RF pulses slightly off-resonance, and in particular, at the fat resonance frequency, effectively suppresses fat signals while providing an adequate MT effect. Two such techniques are disclosed.

In the first technique, assuming a 1.5 T MR imaging apparatus, a fat suppression pulse transmitted at off-resonant frequency of ±220 Hz at 1.5 Telsa (or 3.4 ppm off-resonance) can be made to induce an MT effect by increasing the effective flip angle. By increasing the flip angle, or effectively the $B_1$, of the fat saturation pulse, increases the MT contrast effect with only slight degradation of the fat suppression. It has been found that acceptable MTC effects can be achieved at flip angles of approximately 200° or more using the fat saturation pulse. An example of such a pulse is disclosed in FIG. 2 which shows an RF pulse profile of a spectrally selective suppression pulse 50 according to the present invention. The pulse is a real-valued pulse, and in a preferred embodiment, has the following design parameters: a pulse width of approximately 8 ms, approximately 400 total points, a flip angle of approximately 200°, a 1.0% or less pass band and stop band ripple, a bandwidth of approximately 180 Hz, and is an inversion, minimum phase pulse. In general, the flip angle is set to increase the MTC saturation at least 15% while exhibiting a frequency response with fat suppression of at least 85%. Such a pulse will reduce signal intensity of proteinated tissue to less than 80% of its maximum level to enhance contrast between proteinated tissue and water tissue, and suppress a majority of fat tissue.

Figure 2:
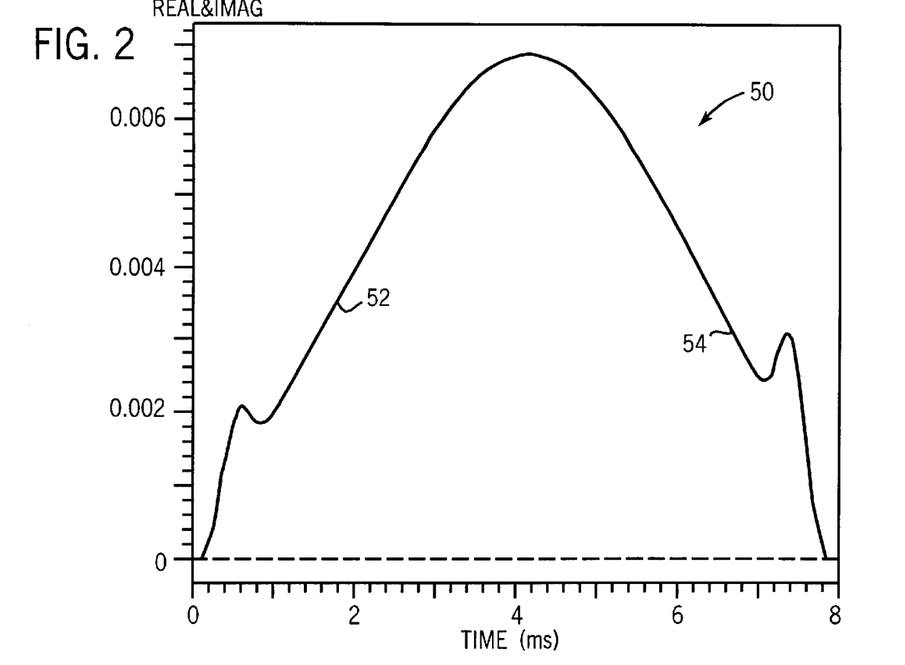
FIG. 2 is a graphical representation of a spectrally selective suppression pulse according to the present invention.

In accordance with the present invention, the flip angle can be set between 100° and 1,000° depending on the image to be acquired, the strength of the magnet in the MR apparatus, the amount of fat suppression desired, as well as what level of specific absorption rate is allowable. The bandwidth of the pulse would likewise depend on the aforementioned factors and can range between 100 Hz and 200 Hz. The pulse width can range from 8 ms to 32 ms for most applications. The transition slopes 52, 54 of FIG. 2, are preferably set to a maximum slope (i.e., with as short a frequency span as possible) to avoid saturating any on-resonance protons. The aforementioned requirements provide a well-defined pulse having good transition bandwidth and minimal pass and stop band ripple so as to avoid saturating the on-resonance frequency protons. As one skilled in the art will readily recognize, as the pulse is brought in further and further on the frequency spectrum, the more important a well-shaped pulse is in order to avoid saturation of on-resonance protons.

Figure 3:
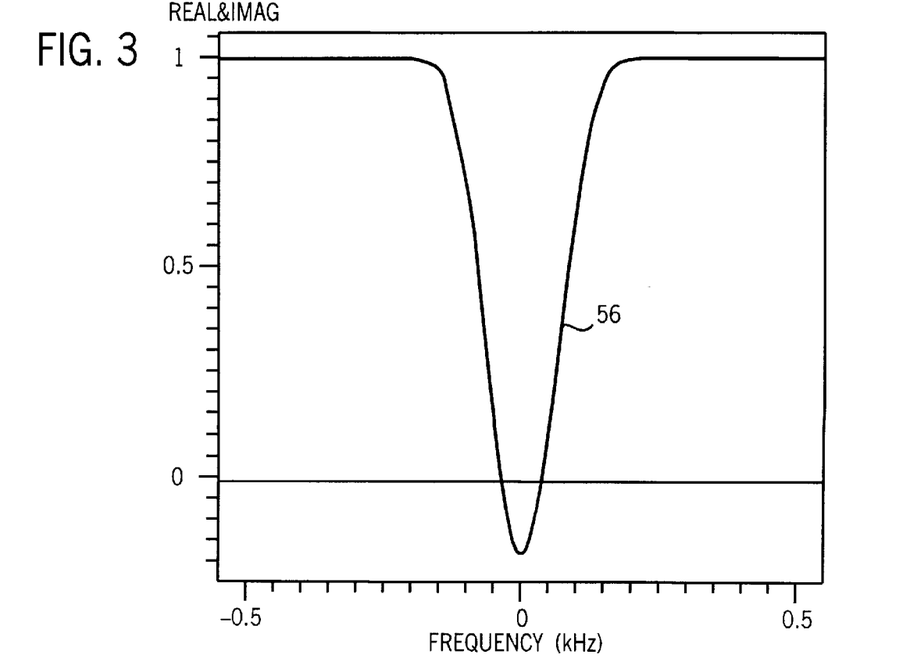
FIG. 3 is a graphical representation of the frequency response of the spectrally selective suppression pulse of FIG. 2.

Referring to FIG. 3, the frequency response 56 of the spectrally selective suppression pulse of FIG. 1 is shown. The longitudinal magnetization ($M_z$) is plotted as a function of frequency and shows that at the on-resonance frequency protons are minimally affected by the magnetization.

Figure 4:
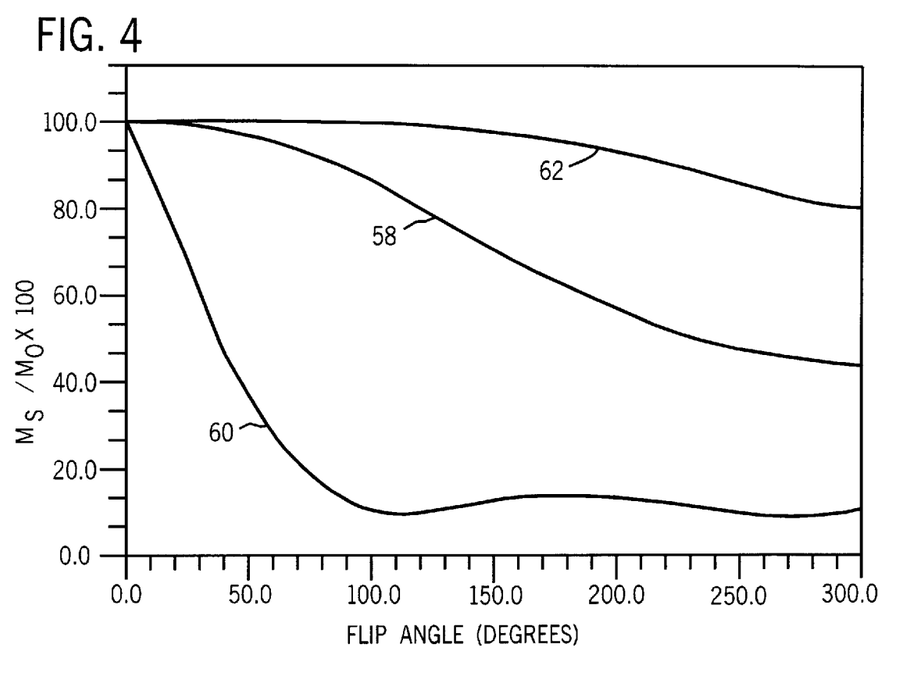
FIG. 4 is a graphical representation of saturation of three tissue types as a function of RF suppression pulse flip angle as acquired from the NMR imaging system of FIG. 1, using an RF pulse according to FIG. 2, as received from a phantom.

FIG. 4 shows a plot of saturation, measured as a percentage, for a phantom having agar, fat, and $CuSO_4$-doped water as a function of RF saturation/suppression pulse flip angle or pulse amplitude. As is known, agar simulates proteinated tissue and is used to mimic the tissue that exhibits MTC effects. It is noted that the agar plot 58 exhibits a pronounced MTC saturation effect as the RF pulse amplitude increases. The plot for fat tissue 60 shows a broad minimum for fat suppression that permits the RF suppression pulse to be overdriven and allow increased MTC saturation of the simulated proteinated tissue 58 while only minimally degrading the fat suppression. Nominally, the RF pulse is applied using a flip angle of at least 100° to provide at least a 16% MTC effect on the agar while providing fat suppression of approximately 90%. Only a 1% saturation of the on-resonance water signal 62 was observed at a flip angle of 100°. The broad minimum suppression of fat tissue 60 allows the flip angle to be increased to provide a corresponding increase in MTC saturation 58. It is noted that increasing the MTC saturation to between 22% and 29%, allows the maintenance of fat suppression at 88%–90%. With the increased RF amplitude, the longer $T_2$ species begin to exhibit increased saturation and there is a negligible degradation in the doped water saturation 62 at the higher flip angles.

Figure 5:
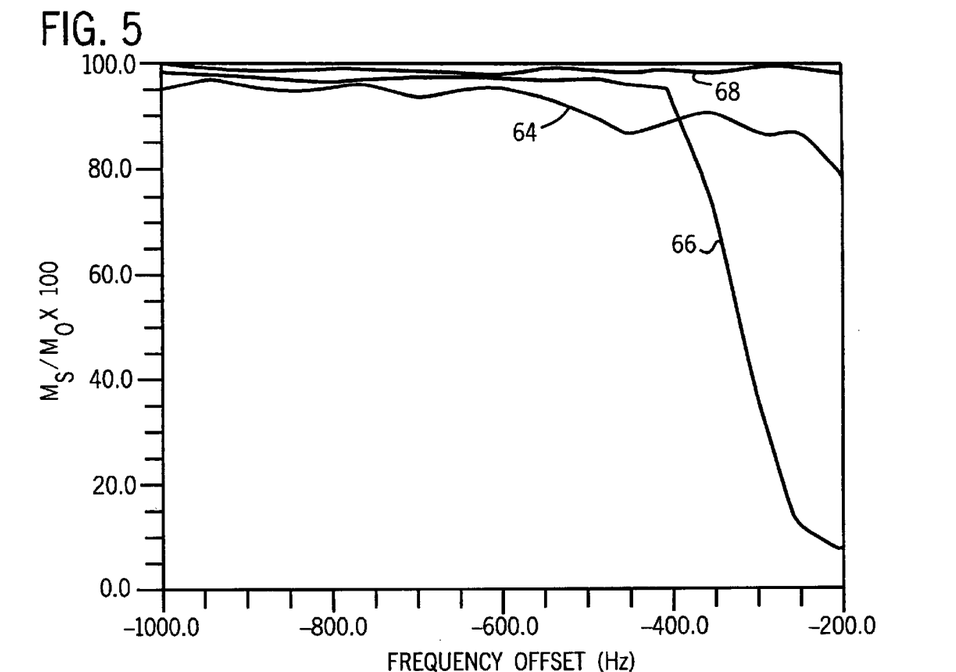
FIG. 5 is a graphical representation of saturation of three tissue types as a function of frequency offset acquired similarly as FIG. 4.

FIG. 5 shows a plot of saturation of the agar 64, the fat tissue 66 and the doped water 68 as a function of frequency offset with the suppression flip angle set at 110°. It is noted that the persistence of agar saturation as compared to fat or water saturation, at higher frequency offsets is indicative of the MTC effect. It is therefore evident from FIG. 5 that the saturation effect observed is due to magnetization transfer and not to a direct saturation of the agar since the agar and water signals are not equally affected by the suppression pulse. In fact, at a frequency offset of approximately −500 Hz, both fat and doped water remain relatively unaffected, while the agar exhibited an 8% saturation level.

Figure 6:
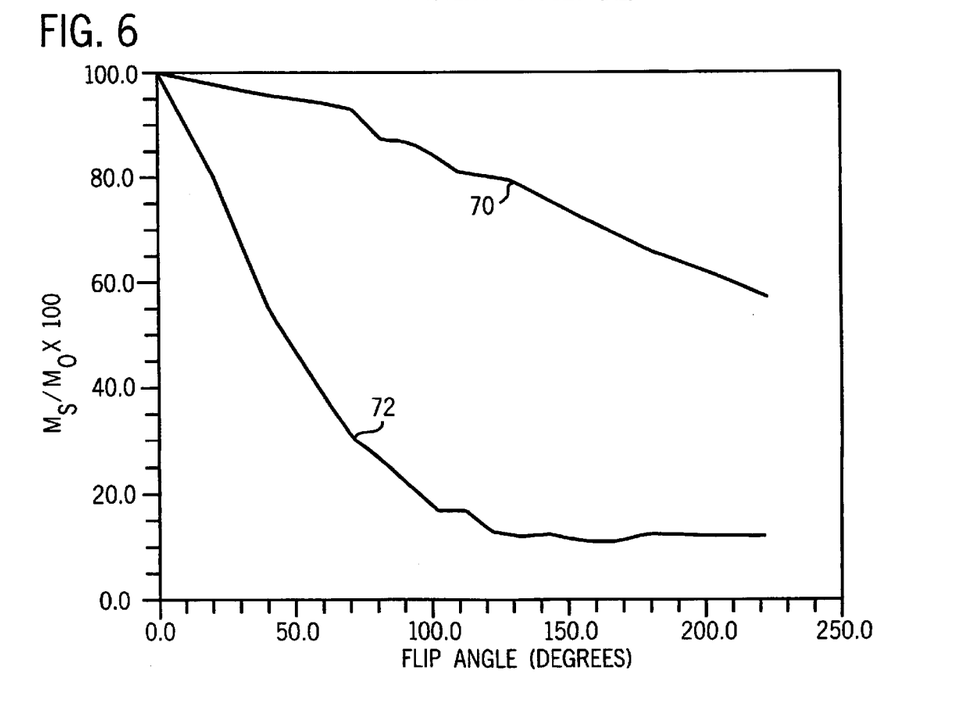
FIG. 6 is a graphical representation of saturation of two tissue types as a function of RF suppression flip angle as acquired from the NMR imaging system of FIG. 1, using an RF pulse according to FIG. 2, as received from a human subject.

FIG. 6 shows actual data points obtained from an MRI of a normal knee of a volunteer patient that shows similar results as depicted in the aforementioned phantom measurements. FIG. 6 is a plot of saturation as a function of RF suppression flip angle in muscle 70 and in the trabecular bone 72, which is fatty marrow. It is noted that the same acquisition parameters were used to acquire the signal intensity in the human knee of FIG. 6 as that for the phantom depicted in FIGS. 4 and 5. The same broad minimum of the fat suppression plot 72 and the same increase in the MTC saturation in the muscle 70, as the flip angle was increased, was found in a scan of the knee as was found in the simulation using the aforementioned phantom. In particular, a 60–70% MTC saturation was obtained while maintaining fat suppression at 85–90%. It is evident that overdriving the spectrally selective suppression RF pulse by approximately 50%, an additional 17% MTC saturation can be obtained.

These results indicate that by slightly overdriving the spectrally selective suppression RF pulse used for fat suppression, a significant MTC effect can be obtained. A further MTC saturation of up to 60% was realized when the RF suppression pulse was driven to just less than 1.5 times the nominal suppression flip angle. However, there is a trade off in that overdriving the spectrally selected suppression RF pulse too far can cause increased suppression of the longer $T_2$ species within the imaged volume. Fat suppression was not compromised with the suggested increase in the suppression RF pulse flip angle.

It is noted that in all the aforementioned examples, the spectrally selective suppression pulse applied was an SLR pulse (a pulse designed using the Shinnar-LeRoux algorithm, Pauley J., Le Roux P., *Parameter Relations for the Shinnar-Le Roux Selective Excitation Pulse Design Algorithm,* IEEE Trans. Med. Imaging, March 1991, Vol. 10: 53–65) that is widely known in the industry. The pulse was applied in a steady state fast gradient recalled echo pulse sequence. The 8 ms pulse was applied once per RF excitation and increased the minimum sequence by about 12 ms, including crusher gradients. The amplitude of the spectrally selective suppression pulse was phase-cycled in a positive (+), negative (−), negative (−), positive (+) fashion to reduce spurious echoes from forming in the data acquisition window. The other pulse design parameters were previously disclosed.

As mentioned, the phantom used for plotting FIGS. 4 and 5 contained agar, a proteinated tissue substitute, fat tissue, and CuSO$_4$-doped water. The pulse sequence parameters were set at 5 mm. thick sections, 24 cm. field-of-view, a 256×128 acquisition matrix, ±32 kH receiver bandwidth, 30° flip angle, and TE/TR of 2.9 and 19.9 ms, respectively. All experiments were performed in a head coil. The MTC saturation effect was measured as a function of the flip angle of the spectrally selective suppression RF pulse and is a function of the frequency offset at a fixed flip angle for the saturation pulse. Similarly, the measurements obtained on the knee were obtained in a head coil with the same acquisition parameters as that of the phantom studies. However, the images acquired were in the coronal plane. The signal intensities were measured in the muscle and in the trabecular bone of the fibula just below the knee for the fat signal. The experimental results using the phantoms indicated an MTC saturation effect of 20%–30% at the fat resonance of ±220 Hz.

Accordingly, the present invention includes a method of differentiating tissue in NMR imaging having the steps of creating a spectrally selective suppression pulse having an RF pulse profile designed to produce a frequency response with high fat suppression and selecting a spectrally selective suppression amplitude to produce a magnetization transfer contrast between two tissue types—proteinated tissue and water tissue. The method also includes applying the spectrally selective suppression pulse with a flip angle selected to optimize fat suppression and magnetization transfer contrast saturation of the two tissue types simultaneously. Preferably, the method results in a magnetization transfer contrast saturation of at least 15% while maintaining fat suppression of at least 80%. Depending on the aforementioned design parameters, the flip angle is set in excess of 100° and less than 1,000°. The spectrally selective suppression pulse should have a bandwidth of between 100 Hz and 200 Hz and have a pulse width of approximately 8–32 ms. It is important to minimize the stop and pass band ripple, preferably to less than 1.0%. The pulse is preferably applied at the fat resonance frequency of approximately ±220 Hz. In order to avoid saturation of on-resonance protons, the pulse should be designed with minimum transition bandwidth.

The invention also includes an MRI apparatus capable of efficient tissue differentiation that includes an MRI system having a plurality of gradient coils positioned about a bore of a magnet to impress a polarizing magnetic field and an RF transceiver system, including an RF modulator controlled by a pulse control module to transmit RF signals to an RF coil assembly to acquire MR images. The MRI apparatus includes a computer program to construct a desired RF pulse based on input design criteria that includes a desired bandwidth, a desired percentage in-band (pass-band) ripple, and desired percentage out-band (stop-band) ripple, so that the desired RF pulse has low stop and pass band ripple and minimal transition bandwidth. The computer is further programmed to select an RF pulse frequency for the desired RF pulse proportional to a fat tissue resonance frequency and select an RF pulse amplitude of the desired RF pulse to maximize a magnetization transfer contrast effect between proteinated tissue and water tissue. The computer is also programmed to transmit the desired RF pulse to the pulse control module to transmit RF signals to the RF coil assembly to acquire MR images having fat suppression and magnetization transfer contrast effect between proteinated tissue and water tissue simultaneously. The resulting acquired MR images enhance the contrast between proteinated tissue and water tissue, while at the same time substantially suppressing fat tissue. The pulse design is as previously described.

The present invention also includes a computer system for use with an MRI apparatus comprising a computer programmed from a computer readable storage medium having thereon a computer program programmed to create a spectrally selective suppression pulse having an RF pulse profile designed to produce a frequency response with high fat suppression and select a spectrally selective suppression amplitude to produce a magnetization transfer contrast between two tissue types, and apply the spectrally selective suppression pulse with a flip angle selected to optimize fat suppression and magnetization transfer contrast saturation simultaneously for the MRI apparatus. The computer system is implemented using the same pulse design criteria as previously described.

An alternate embodiment of the present invention includes modulating an RF pulse similar to that as shown in FIG. 2, with a sinusoidal function in that at least two spectrally selected suppression pulses are applied simultaneously but with a proportional reduction in the RF amplitude, each applied at the same absolute frequency value but on opposite sides of the frequency spectrum. The frequency response of the resultant pulse is a frequency response of the original single RF pulse, but replicated on the other side of the on-resonance carrier frequency, the spacing of which is determined by the frequency of the modulation function. An example of such a pulse is the known Hadamard encoded pulse, which results in excitation on both sides of the transmitter frequency. This results in an effective MTC effect equivalent to 2θ, if the fat saturation pulse is θ in the aforementioned embodiment.

Accordingly, the invention includes the alternative step of applying at least two of the spectrally selective suppression pulses simultaneously and distributed evenly on each side of a resonance frequency, each having a proportional amount of total RF power. In a more specific application, the method includes applying only two spectrally selective suppression pulses simultaneously at off-resonance frequency, each having one-half of the total RF power applied, and wherein one of the spectrally selective suppression pulses is applied at a desired fat suppression frequency on a positive side of the resonance frequency and the other is applied at the desired fat suppression frequency on a negative side of the resonance frequency. These alternative method steps are equivalently applicable to the apparatus as well in that the computer can equivalently be programmed to accomplish these alternative steps.

A specific implementation of the aforementioned invention is to enhance blood vessel visibility in an MRI by producing a magnetization transfer contrast between blood in a vessel and myocardial tissue located about the vessel while suppressing associated fat about the vessel to thereby producing an improved MR image of the blood vessel. In a preferred embodiment, the blood vessel is a coronary artery and the MR image is an MR angiograph. The step of applying the spectrally selective suppression pulse is further defined as applying the spectrally selective suppression pulse to a patient in imaging the heart such that an MR angiogram of the patient's coronary arteries is acquired, and further includes the step of reconstructing an image of the patient's coronary arteries wherein the image reconstructed suppresses fat and simultaneously enhances contrast between blood in the coronary artery and myocardial about the coronary artery.

The computer of the MRI apparatus of the present invention is also programmed, in a preferred embodiment, to enhance cardiac vessel visibility in an MRI by producing a magnetization transfer contrast between blood in a cardiac vessel and myocardial tissue located about the cardiac vessel while suppressing associated fat about the cardiac vessel to thereby produce an MR angiograph of the coronary arteries. Further, in a preferred embodiment, the computer is programmed to apply the spectrally selective suppression pulse to a patient's coronary arteries to acquire an MR image of the patient's coronary arteries, and to reconstruct an image of the patient's coronary arteries wherein the resulting image reconstructed adequately suppresses fat and enhances contrast between blood in the coronary artery and myocardial tissue located about the coronary artery, simultaneously.

The present invention has been described in terms of the preferred embodiment, and it is recognized that equivalents, alternatives and modifications, aside from those expressly stated, are possible and within the scope of the appending claims.

What is claimed is:

1. A method of differentiating tissue in NMR imaging comprising the steps of:
   creating a spectrally selective suppression pulse having an RF pulse profile designed to produce a frequency response with high fat suppression;
   selecting a spectrally selective suppression amplitude to produce a magnetization transfer contrast between two tissue types; and
   applying the spectrally selective suppression pulse with a flip angle selected to optimize fat suppression and magnetization transfer contrast saturation simultaneously.

2. The method of claim 1 further comprising the step of setting the flip angle to increase the magnetization transfer contrast saturation at least 15% while exhibiting a frequency response with fat suppression of at least 80%.

3. The method of claim 1 further comprising the step of setting the flip angle in excess of 100° and less than 1,000°.

4. The method of claim 1 further comprising the step of optimally designing a spectrally selective suppression pulse with a bandwidth of between 100 and 200 Hz and having a pulse width of approximately 8–32 ms.

5. The method of claim 4 wherein the step of optimally designing a spectrally selective suppression pulse further includes minimizing stop band ripple.

6. The method of claim 4 wherein the step of optimally designing a spectrally selective suppression pulse further includes setting a pass band ripple to less than 1% of the spectrally selective suppression pulse.

7. The method of claim 1 further comprising the step of applying the spectrally selective suppression pulse centered on ±220 Hz resonance offset from the carrier frequency at 1.5 Tesla, which is an offset of 3.4 ppm at any field strength.

8. The method of claim 4 wherein the step of optimally designing a spectrally selective suppression pulse further includes a pulse design having minimal outer band ripple and maximum transition band slope.

9. The method of claim 1 further comprising the step of applying at least two of the spectrally selective suppression pulses simultaneously and distributed evenly on each side of a resonance frequency, each having a proportional amount of total RF power.

10. The method of claim 9 wherein only two spectrally selective suppression pulses are applied simultaneously at off-resonance frequencies, each having one-half of the total RF power, and wherein one of the spectrally selective suppression pulses is applied at a desired fat suppression frequency on a positive side of the resonance frequency and another is applied at the desired fat suppression frequency on a negative side of the resonance frequency.

11. The method of claim 1 further comprising the step of enhancing vessel visibility in an MRI by producing a magnetization transfer contrast between blood in a vessel and myocardial tissue located about the vessel while suppressing associated fat about the vessel to thereby produce an improved MR image of the vessel.

12. The method of claim 11 wherein the vessel is a coronary artery and the MR image is an MR angiogram.

13. The method of claim 1 wherein the step of applying the spectrally selective suppression pulse is further defined as applying the spectrally selective suppression pulse to a patient's coronary arteries to acquire an MR angiograph of the patient's coronary arteries, and the method further comprises the step of reconstructing an image of the patient's coronary arteries, wherein the image reconstructed suppresses fat and simultaneously enhances contrast between blood in the coronary artery and myocardial about the coronary artery.

14. An MRI apparatus capable of efficient tissue differentiation comprising:
   a magnetic resonance imaging (MRI) system having a plurality of gradient coils positioned about a bore of a magnet to impress a polarizing magnetic field and an RF transceiver system having an RF modulator controlled by a pulse control module to transmit RF signals to an RF coil assembly to acquire MR images; and
   a computer programmed to:
      construct a desired RF pulse based on input design criteria including desired bandwidth, desired percentage in-band ripple, and desired percentage out-band ripple, so that the desired RF pulse has low stop and pass band ripple and high transition band slope;
      select an RF pulse frequency for the desired RF pulse proportional to a fat tissue resonance frequency;

select an RF pulse amplitude of the desired RF pulse to maximize a magnetization transfer contrast effect between proteinated tissue and water tissue; and transmit the desired RF pulse to the pulse control module to transmit RF signals to the RF coil assembly to acquire MR images having fat suppression and magnetization transfer contrast effect between proteinated tissue and water tissue simultaneously, such that the acquired MR images enhance a contrast between proteinated tissue and water tissue, and suppresses fat tissue.

15. The MRI apparatus of claim 14 wherein the computer is further programmed to construct the desired RF pulse based on whether a simultaneous sinusoidal RF pulse train is desired.

16. The MRI apparatus of claim 14 wherein the computer is further programmed to set a flip angle to increase the magnetization transfer contrast saturation at least 15% while exhibiting a frequency response having fat suppression of at least 80%.

17. The MRI apparatus of claim 16 wherein the computer is further programmed to set the flip angle in excess of 100° and less than 1,000°.

18. The MRI apparatus of claim 14 wherein the computer is further programmed to:

optimally design a spectrally selective suppression pulse with a bandwidth of between 100 Hz and 200 Hz and a pulse width of approximately 8–32 ms; and apply the spectrally selective suppression pulse centered on ±220 Hz resonance offset from the carrier frequency at 1.5 Tesla, which is an offset of 3.4 ppm at any field strength.

19. The MRI apparatus of claim 14 wherein the computer is further programmed to apply two spectrally selective suppression pulses simultaneously at off resonance frequencies, each having one-half of the total RF power wherein one of the spectrally selective suppression pulses is applied at a desired fat suppression frequency on a positive side of the resonance frequency and another is applied at the desired fat suppression frequency on a negative side of the resonance frequency.

20. The MRI apparatus of claim 14 wherein the computer is further programmed to enhance cardiac vessel visibility in an MRI by producing a magnetization transfer contrast between blood in a cardiac vessel and myocardial tissue located about the cardiac vessel while suppressing associated fat about the cardiac vessel to thereby produce an MR angiograph of the cardiac vessel.

21. The MRI apparatus of claim 14 wherein the computer is further programmed to apply the spectrally selective suppression pulse to a patient's coronary arteries to acquire an MR image of the patient's coronary arteries, and to reconstruct an image of the patient's coronary arteries, wherein the image reconstructed suppresses fat and enhances contrast between blood in the coronary artery and myocardial about the coronary artery simultaneously.

22. A computer system for use with an MRI apparatus comprising a computer programmed from a computer readable storage medium having thereon a computer program programmed to:

create a spectrally selective suppression pulse having an RF pulse profile designed to produce a frequency response with high fat suppression;

select a spectrally selective suppression amplitude to produce a magnetization transfer contrast between two tissue types; and apply the spectrally selective suppression pulse with a flip angle selected to optimize fat suppression and magnetization transfer contrast saturation simultaneously for an MRI apparatus.

23. A computerized system of claim 22 wherein the computer is further programmed to increase the magnetization transfer contrast saturation in a patient image at least 15% while simultaneously providing fat saturation of at least 80%.

24. The computerized system of claim 22 wherein the computer is further programmed to set a flip angle in excess of 100° and less than 1,000°.

25. The computerized system of claim 22 wherein the computer is further programmed to apply the spectrally selective suppression pulse at ±220 Hz resonance offset from the carrier frequency at 1.5 Tesla, which is an offset of 3.4 ppm at any field strength.

26. The computerized system of claim 22 wherein the computer is further programmed to apply a spectrally selective suppression pulse with minimal outer band ripple and maximum transition band slope.

27. The computerized system of claim 22 wherein the computer is further programmed to:

apply two spectrally selective suppression pulses, one on a positive side of the frequency spectrum and one on a negative side of the frequency spectrum, both at a same absolute frequency value; and select a lower spectrally selective suppression amplitude for each spectrally selective suppression such that a specific absorption rate to a patient is no more than that of applying a single spectrally selective suppression pulse while increasing the magnetization transfer contrast saturation.

28. The computerized system of claim 22 wherein the computer is further programmed to enhance cardiac vessel visibility in an MRI by producing a magnetization transfer contrast between blood in a cardiac vessel and myocardial tissue located about the cardiac vessel while suppressing associated fat about the cardiac vessel and to produce an MR angiogram of the cardiac vessel.

29. The computerized system of claim 22 wherein the computer is further programmed to apply the spectrally selective suppression pulse to a patient's coronary arteries to acquire an MR image of the patient's coronary arteries, and to reconstruct an image of the patient's coronary arteries, wherein the image reconstructed suppresses fat and enhances contrast between blood in the coronary artery and myocardial about the coronary artery simultaneously.

* * * * *